United States Patent
Park et al.

(10) Patent No.: US 10,862,056 B2
(45) Date of Patent: Dec. 8, 2020

(54) DISPLAY DEVICE AND METHOD OF MANUFACTURING THE SAME

(71) Applicant: Samsung Display Co., Ltd., Yongin-si (KR)

(72) Inventors: Sungjune Park, Yongin-si (KR); Jinkyu Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 16 days.

(21) Appl. No.: 15/849,521

(22) Filed: Dec. 20, 2017

(65) Prior Publication Data

US 2019/0013487 A1    Jan. 10, 2019

(30) Foreign Application Priority Data

Jul. 5, 2017  (KR) .......................... 10-2017-0085619

(51) Int. Cl.
| | |
|---|---|
| *H01L 51/00* | (2006.01) |
| *H01L 51/52* | (2006.01) |
| *H01L 27/32* | (2006.01) |

(52) U.S. Cl.
CPC ........ *H01L 51/0097* (2013.01); *H01L 51/529* (2013.01); *H01L 51/5253* (2013.01); *H01L 51/5284* (2013.01); *H01L 27/3272* (2013.01); *H01L 2251/5338* (2013.01)

(58) Field of Classification Search
CPC ............. H01L 51/0097; H01L 51/5253; H01L 51/529; H01L 27/3272; H01L 27/3244
See application file for complete search history.

(56) References Cited

U.S. PATENT DOCUMENTS

2016/0190511 A1    6/2016   Choi et al.

FOREIGN PATENT DOCUMENTS

| KR | 10-2014-0063304 | | 5/2014 | | |
|---|---|---|---|---|---|
| KR | 20140063304 | A * | 5/2014 | ......... | H01L 51/0097 |
| KR | 20140063304 | A * | 5/2014 | ......... | H01L 27/1262 |
| KR | 101439261 | B1 * | 9/2014 | ......... | H01L 27/1262 |
| KR | 10-2015-0129174 | | 11/2015 | | |
| KR | 10-2016-0080994 | | 7/2016 | | |

* cited by examiner

*Primary Examiner* — Andrew Q Tran
(74) *Attorney, Agent, or Firm* — H.C. Park & Associates, PLC

(57) ABSTRACT

A display device including: a flexible substrate having a first surface and a second surface opposite the first surface; a display unit arranged on the first surface of the flexible substrate; and a lower protective film arranged on the second surface and including a base film, an adhesive layer arranged on one side of the base film, a light-shielding layer arranged on the other side of the base film, and a conductive material layer interposed between the base film and the light-shielding layer.

20 Claims, 5 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2017-0085619, filed on Jul. 5, 2017, which is hereby incorporated by reference for all purposes as if fully set forth herein.

BACKGROUND

Field

Exemplary embodiments relate to a display device and a method of manufacturing the same, and more particularly, to a display device having an excellent light-shielding ratio and improved flexibility at the same time, and a method of manufacturing the same.

Discussion of the Background

Recently, bendable or foldable display devices using flexible within have increasingly gained attention and accordingly, research into such bendable or foldable display devices has increased.

A flexible substrate using a material such as synthetic resin, but not a conventional glass substrate, is utilized to achieve a bendable or foldable display device. A display panel is implemented in such a form that various layers including a display unit are stacked on the flexible substrate.

The above information disclosed in this Background section is only for enhancement of understanding of the background of the inventive concepts, and, therefore, it may contain information that does not form the prior art that is already known in this country to a person of ordinary skill in the art.

SUMMARY

According to a conventional display device and a method of manufacturing the same, the display device is difficult to maintain a bendable or foldable characteristic since a plurality of layers are stacked on the display device and a thickness of the display device increases.

One or more exemplary embodiments of the inventive concepts include a display device having an excellent light-shielding ratio and improved flexibility at the same time, and a method of manufacturing the same. However, this is merely an example, and the scope of the present disclosure is not limited thereto.

Additional aspects will be set forth in the detailed description which follows, and, in part, will be apparent from the disclosure, or may be learned by practice of the inventive concepts.

According to one or more exemplary embodiments, a display device includes: a flexible substrate having a first surface and a second surface opposite the first surface; a display unit arranged on the first surface of the flexible substrate; and a lower protective film arranged on the second surface and including a base film, an adhesive layer arranged on one side of the base film, a light-shielding layer arranged on the other side of the base film, and a conductive material layer interposed between the base film and the light-shielding layer.

The conductive material layer may include a first organic material and conductive particles dispersed in the first organic material.

The light-shielding layer may include a second organic material and light-shielding particles dispersed in the second organic material.

The first organic material and the second organic material may include an identical material.

The light-shielding layer may be arranged directly on the conductive material layer.

The light-shielding layer may be coated on the conductive material layer by using a thermal transfer method.

The base film, the conductive material layer, and the light-shielding layer, which are sequentially stacked on the adhesive layer being in direct contact with the second surface of the flexible substrate, may be integrally formed.

The light-shielding layer may have a thickness of about 1 µm to about 3 µm.

The base film may include an organic material having flexible characteristics.

The display device may further include a heat dissipation layer arranged opposite the light-shielding layer, and a shock absorbing layer interposed between the light-shielding layer and the heat dissipation layer.

According to one or more exemplary embodiments, a method of manufacturing a display device includes: manufacturing a display panel by preparing a flexible substrate having a first surface and a second surface opposite the first surface, and forming a display unit on the first surface of the flexible substrate; forming a lower protective film by forming a base film and an adhesive layer on one side of the base film, forming a conductive material layer on the other side of the base film, and forming a light-shielding layer on the conductive material layer; and attaching the lower protective film on the second surface.

The conductive material layer may include a first organic material and conductive particles dispersed in the first organic material.

The light-shielding layer may include a second organic material and light-shielding particles dispersed in the second organic material.

The first organic material and the second organic material may include an identical material.

The light-shielding layer may be arranged directly on the conductive material layer.

The light-shielding layer may be formed on the conductive material layer by using a thermal transfer method.

The base film, the adhesive layer, the conductive material layer, and the light-shielding layer of the lower protective film are integrally formed.

The light-shielding layer may have a thickness of about 1 µm to about 3 µm.

The base film may include an organic material having flexible characteristics.

The method of manufacturing a display device may further include: arranging a heat dissipation layer on a side of the light-shielding layer that is away from the display panel; and arranging a shock absorbing layer on a side of the heat dissipation layer that is away from the light-shielding layer.

The foregoing general description and the following detailed description are exemplary and explanatory and are intended to provide further explanation of the claimed subject matter.

These general and specific embodiments may be implemented by using a system, a method, a computer program, or a combination thereof.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
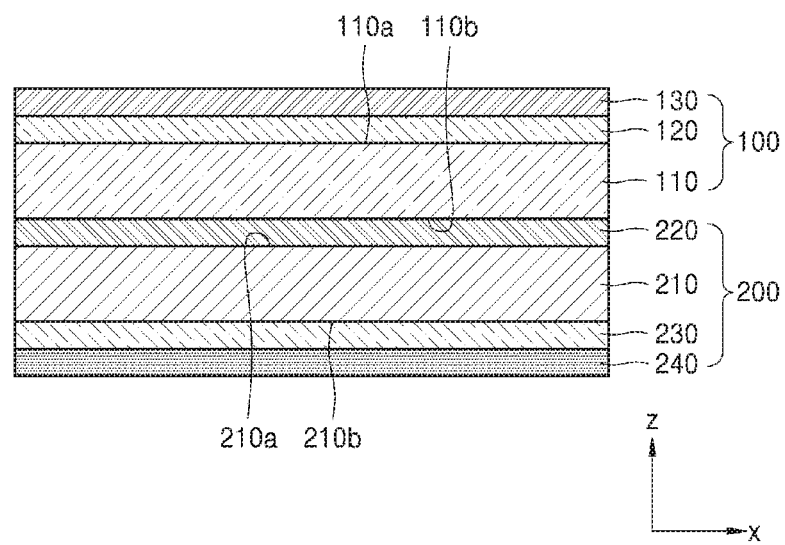
FIG. 1 is a cross-sectional view of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
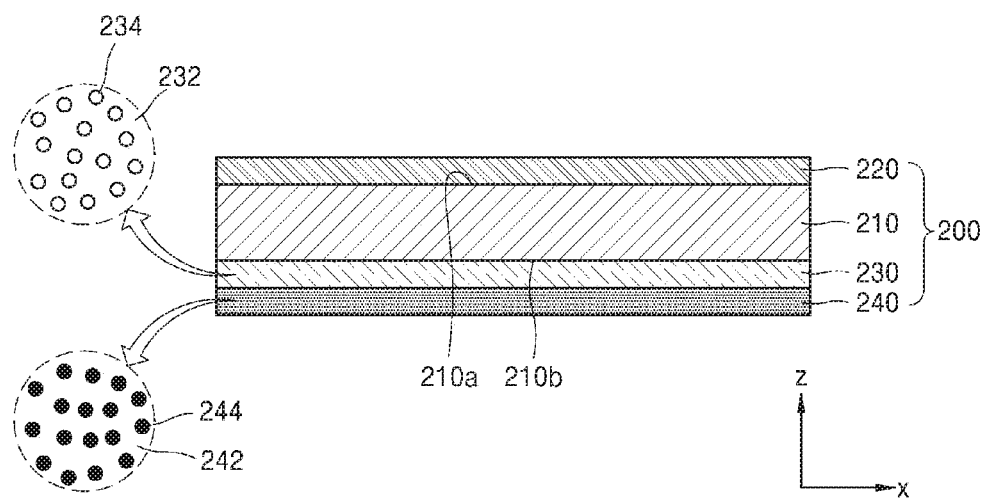
FIG. 2 is a cross-sectional view of a portion of the display device of FIG. 1.

FIG. 1 is a cross-sectional view of a display device according to an exemplary embodiment, and FIG. 2 is a cross-sectional view of a portion of the display device of FIG. 1. FIG. 2 schematically shows a lower protective film of the display device of FIG. 1.

Referring to FIG. 1, the display device according to the exemplary embodiment includes a display panel 100 and a lower protective film 200 disposed under the panel 100. The display panel 100 according to the exemplary embodiment includes a flexible substrate 110, a display unit 120 arranged on the flexible substrate 110, and a sealing unit 130. The lower protective film 200 according to the exemplary embodiment includes a base film 210, an adhesive layer 220, a light-shielding layer 240, and a conductive material layer 230 interposed between the base film 210 and the light-shielding layer 240.

The flexible substrate 110 may include a variety of materials that are flexible or bendable, for example, a polymer resin such as polyethersulphone (PES), polyacrylate, polyetherimide (PEI), polyethylene (PEN), polyethylene terephthalate (PET), polyphenylene sulfide (PPS), polyarylate (PAR), polyimide (PI), polycarbonate (PC), or cellulose acetate propionate (CAP). In addition, the flexible substrate 110 may have a multilayer structure including two layers containing the polymer resin, and a barrier layer containing an inorganic material (such as silicon oxide ($SiO_2$), silicon nitride ($SiN_x$), silicon oxynitride (SiON), etc.) interposed between the two layers, and various modifications thereof are possible.

The flexible substrate 110 is a rectangular plate in the exemplary embodiment, but is not limited thereto. The flexible substrate 110 may have a first surface 110a and a second surface 110b opposite the first surface 110a. Furthermore, the display panel 100 including the flexible substrate 110 is basically flexible. All or a portion of the display panel 100 may be bent or folded at a predetermined angle, or a shape of the display panel 100 may be deformed according to a user's demand.

The display unit 120 may be arranged on the first surface 110a of the flexible substrate 110. The display unit 120 may include a thin-film transistor TFT and a display device electrically connected to the thin-film transistor TFT. The sealing unit 130 may be arranged on the display unit 120. The sealing unit 130 may be arranged on the display unit 120 to cover and seal the display unit 120 from the outside. A structure of the display panel 100 including the display unit 120 and the sealing unit 130 will be described below in detail with reference to FIG. 3.

The lower protective film 200 may be arranged on a lower portion of the display panel 100. The lower portion of the display panel 100 may be understood as the second surface 110b of the flexible substrate 110. The lower protective film 200 may include the base film 210, the adhesive layer 220, the light-shielding layer 240, and the conductive material layer 230 interposed between the base film 210 and the light-shielding layer 240.

Referring to FIGS. 1 and 2, the base film 210 has a flexible property and may be formed of a plastic material such as PET, PEN, PI, or the like. In the exemplary embodiment, a PI having an excellent flexibility is used as a main material of the base film 210, but the exemplary embodiment is not limited thereto.

The adhesive layer 220 may be arranged on one surface 210a of the base film 210. In an alternative exemplary embodiment, the adhesive layer 220 may include organic materials, such as a Pressure Sensitive Adhesive (PSA). The adhesive layer 220 may be interposed between the flexible substrate 110 and the base film 210 and the lower protective film 200 may be attached on the second surface 110b of the flexible substrate 110 through the adhesive layer 220.

The conductive material layer 230 may be arranged on the other surface 210b of the base film 210. When the lower protective film 200 is attached to the display panel 100, static electricity is generated between the display panel 100 and the lower protective film 200. The generated static electricity may change electrical characteristics of an organic light-emitting diode (OLED) by moving a voltage of the thin-film transistor TFT in a positive direction. As a result, reliability and driving stability of the display panel 100 may be deteriorated. Accordingly, the conductive material layer 230 may be arranged on the other surface 210b of the base film 210 and the static electricity generated through the conductive material layer 230 may be prevented from flowing into the display panel 100.

In the exemplary embodiment, the conductive material layer 230 may include a first organic material 232 and conductive particles 234 dispersed therein. In an alternative exemplary embodiment, the first organic material 232 may be a urethane-based binder, an acrylic binder, or the like, but the exemplary embodiment is not limited thereto. Also, in an alternative exemplary embodiment, the conductive particles 234 may be formed of a variety of materials including materials having conductivity, and may include, for example, poly(3,4-ethylenedioxythiophene) (PEDOT) or a conductor of at least one of a carbon nanotube (CNT), fullerene, and a nanowire. However, the exemplary embodiment is not limited thereto. Since the conductive particles 234 are dispersed in the first organic material 232 as described above, the conductive particles 234 may have water-soluble properties.

The light-shielding layer 240 may be arranged on the conductive material layer 230. The fact that the light-shielding layer 240 is arranged on the conductive material layer 230 means that the conductive material layer 230 is formed on the other surface 210b of the base film 210, and the light-shielding layer 240 is formed directly on the conductive material layer 230 on the surface that is not connected to the other surface 210b of the base film 210. As shown in FIG. 2, the base film 210, the conductive material layer 230, and the light-shielding layer 240 may be sequentially stacked on the other surface 210b of the base film 210.

In the exemplary embodiment, the light-shielding layer 240 may include the second organic material 242 and light-shielding particles 244 dispersed therein. In an alternative exemplary embodiment, a second organic material 242 may be a urethane-based binder, an acrylic binder, or the like, but the exemplary embodiment is not limited thereto. In an alternative exemplary embodiment, the light-shielding particles 244 may include a resin Black Matrix (BM), carbon black, $Fe_3O_4$, and the like, but the exemplary embodiment is not limited thereto.

As described above, the light-shielding layer 240 is directly arranged on the conductive material layer 230, and the light-shielding layer 240 may be formed directly on the conductive material layer 230 according to a manufacturing process. The light-shielding layer 240 may be formed directly on the conductive material layer 230 by the first organic material 232 included in the conductive material layer 230 and the second organic material 242 included in the light-shielding layer 240. Therefore, when the first organic material 232 and the second organic material 242 include an identical material, a bonding strength between the conductive material layer 230 and the light-shielding layer 240 is improved to be advantageous for forming the light-shielding layer 240. However, even if the first organic material 232 and the second organic material 242 include different materials, it is sufficient if the first organic material 232 and the second organic material 242 have a bonding force suitable for forming the light-shielding layer 240 including similar organic materials.

When the display device emits light on only one side as a front emission or a back emission, rather than both-side emission, the light-shielding layer 240 may be arranged such that light does not emit out to the opposite side. The display device according to the exemplary embodiment basically includes the flexible substrate 110 and is implemented as the display panel 100 that can be bent or folded. Functional layers having various functions may be stacked on one side and the other side of the display panel 100, and the above-described lower protective film 200 is one of the functional layers.

Here, when the light-shielding layer 240 is to be arranged as described above, black ink or the like is coated on both sides of a separate flexible film, and the adhesive layer 220 is coated on both sides with the black ink to attach an integrated light-shielding film in which a plurality of layers are stacked, to the lower protective film 200, so that a function of the light-shielding layer 240 is performed. However, in this case, a thickness of the functional layers arranged on the display panel 100 increases, and thus flexibility of the display device, which is preferred, is rapidly deteriorated.

Since the display device according to the exemplary embodiment forms the lower protective film 200 is integrally provided with the light-shielding layer 240, it is possible to prevent flexibility of the display device from being drastically deteriorated due to an increased thickness of the display device by attaching a separate shielding film to the lower protective film 200.

In addition, the display device according to the exemplary embodiment includes a similar type of organic material to improve a bonding strength between the conductive material layer 230 and the light-shielding layer 240, so that the light-shielding layer 240 may be directly formed on the conductive material layer 230 easily. The light-shielding layer 240 formed directly on the conductive material layer 230 has a thickness of about 1 μm to 3 μm, that is, a thickness of about 1/10 of a thickness of a separate light-shielding film provided in an integrated form.

As the light-shielding layer 240 is directly formed on the conductive material layer 230, the conductive material layer 230 and the light-shielding layer 240 may be integrally formed. In the exemplary embodiment, the light-shielding layer 240 may be formed on the conductive material layer 230 by using a thermal transfer method, but the exemplary embodiment is not limited thereto.

Figure 3:
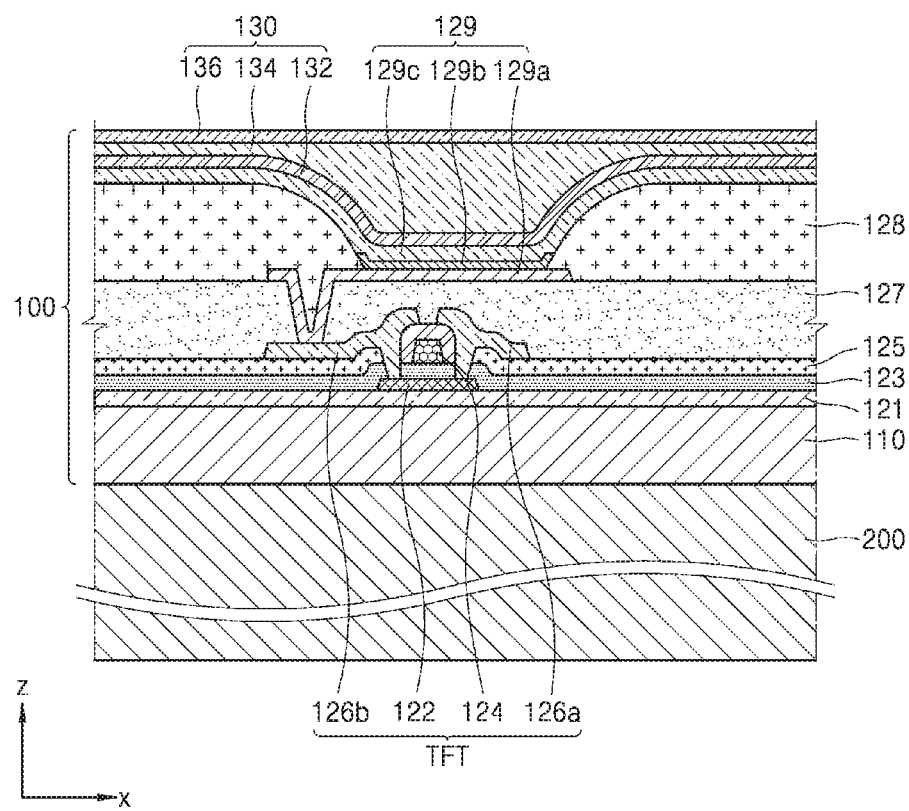
FIG. 3 is a cross-sectional view of a portion of the display device of FIG. 1.

FIG. 3 is a cross-sectional view of a portion of the display device of FIG. 1. FIG. 3 schematically shows an enlarged structure of a display panel of the display device of FIG. 1.

Referring to FIG. 3, the display panel 100 according to the exemplary embodiment may include a flexible substrate 110, an OLED 129 electrically connected to the thin-film transistor TFT arranged on the flexible substrate 110, and the sealing unit 130 for sealing the OLED 129. The lower protective film 200 may be arranged under the display panel 100.

The thin-film transistor TFT may be located on the flexible substrate 110. The thin-film transistor TFT may include a semiconductor layer 122 including amorphous silicon, polycrystalline silicon, or an organic semiconductor material, a gate electrode 124, a source electrode 126a, and a drain electrode 126b.

A gate insulating film 123 including an inorganic material such as $SiO_2$, $SiN_x$, and/or SiON may be interposed between the semiconductor layer 122 and the gate electrode 124 in order to ensure an insulating property between the semiconductor layer 122 and the gate electrode 124. An interlayer insulating layer 125 including an inorganic material such as $SiO_2$, $SiN_x$, and/or SiON may be arranged on the gate electrode 124. The source electrode 126a and the drain electrode 126b may be arranged on the interlayer insulating film 125. An insulating film including an inorganic material may be formed through chemical vapor deposition (CVD) or atomic layer deposition (ALD). This also applies to the following exemplary embodiments and variations thereof.

A buffer layer 121 including an inorganic material such as $SiO_2$, $SiN_x$, and/or SiON may be interposed between the thin-film transistor TFT and the flexible substrate 110 having such structure. The buffer layer 121 may serve to flatten an upper surface of the flexible substrate 110 or prevent or minimize impurities from the flexible substrate 110 or the like from penetrating into the semiconductor layer 122 of the thin-film transistor TFT.

A planarization layer 127 may be arranged above the thin-film transistor TFT. For example, as shown in FIG. 3, when the OLED 129 is arranged on the thin-film transistor TFT, the planarization layer 127 may generally flatten an upper portion of a protective film covering the TFT. The planarization layer 127 may be formed of an organic material such as acryl, benzocyclobutene (BCB), or hexamethyldisiloxane (HMDSO). Although the planarization layer 127 is shown as a monolayer in FIG. 3, the planarization layer 127 may be a multilayer and various modifications are possible.

The OLED 129 having a pixel electrode 129a, an opposite electrode 129c, and an intermediate layer 129b interposed therebetween and may include an emission layer arranged on the planarization layer 127. As shown in FIG. 3, the pixel electrode 129a is electrically connected to the thin-film transistor TFT through contact with either the source electrode 126a or the drain electrode 126b through an opening formed in the planarization layer 127 or the like.

A pixel defining layer 128 may be arranged on the planarization layer 127. The pixel defining layer 128 defines pixels by including an opening corresponding to each of sub pixels, that is, an opening exposing at least a center of the pixel electrode 129a. Furthermore, as shown in FIG. 3, the pixel defining layer 128 prevents generation of an arc or the like at the edge of the pixel electrode 129a by increasing a distance between the edge of the pixel electrode 129a and the opposite electrode 129c over the pixel electrode 129a. The pixel defining layer 128 may be formed of an organic material such as PI or HMDSO.

The intermediate layer 129b of the OLED 129 may include a low molecular weight material or a high molecular weight material. If the intermediate layer 129b includes a is low molecular weight material, the intermediate layer 129b may be formed in a single or a composite structure by stacking a Hole Injection Layer (HIL), a Hole Transport Layer (HTL), an Emission Layer (EML), an Electron Transport Layer (ETL), and an Electron Injection Layer (EIL). The intermediate layer 129b may include various organic materials, such as copper phthalocyanine (CuPc), N,N'-Di (naphthalene-1-yl)-N,N'-diphenyl-benzidine (NPB), and tris-8-hydroxyquinoline aluminum (Alq3). The layers may be formed by an evaporation method.

When the intermediate layer 129b includes a high molecular weight material, the intermediate layer 129b may have a structure including an HTL and an EML. The HTL may include PEDOT and the EML may include a high molecular weight material, such as poly-phenylenevinylene (PPV) and polyfluorene. The intermediate layer 129b may be formed by using a screen printing method, an ink jet printing method, or a laser induced thermal imaging (LITI) method.

The intermediate layer 129b is not limited thereto, but may have various structures. Also, the intermediate layer 129b may include an integral layer over a plurality of pixel electrodes 129a or may have a layer patterned to correspond to each of the pixel electrodes 129a.

The opposite electrode 129c may be arranged on the intermediate layer 129b. The opposite electrode 129c may be integrally formed over a plurality of OLEDs 129 to correspond to the plurality of the pixel electrodes 129a.

Since the OLED 129 may be easily damaged by moisture or oxygen from the outside, the sealing unit 130 may cover and protect the OLED 129. The sealing unit 130 may be arranged over the entire surface of the flexible substrate 110 and extend to the edge of the flexible substrate 110. The sealing unit 130 may include a first inorganic sealing film 132, an organic sealing film 134, and a second inorganic sealing film 136 as shown in FIG. 3.

The first inorganic sealing film 132 covers the opposite electrode 129c, and may include $SiO_2$, $SiN_x$, and/or SiON. If necessary, another layer, for example, a capping layer may be interposed between the first inorganic sealing film 132 and the opposite electrode 129c.

Since the first inorganic sealing film 132 is formed along the lower structure, an upper surface of the first inorganic sealing film 132 is not flat as shown in FIG. 3. The organic sealing film 134 covers the first inorganic encapsulation layer 132. However, unlike the first inorganic encapsulation layer 132, an upper surface of the organic sealing film 134 may be formed generally flat. The organic sealing film 134 may include at least one selected from the group consisting of PET, PEN, PC, PI, PES, polyoxymethylene (POM), PAR, and HMDSO.

The second inorganic sealing film 136 covers the organic sealing film 134 and may include $SiO_2$, $SiN_x$, and/or SiON. The second inorganic sealing film 136 may not be exposed to the outside because the second inorganic sealing film 136 contacts the first inorganic sealing film 132 at the edge of flexible substrate 110.

In this manner, with the sealing unit 130 having a multilayer structure including the first inorganic sealing film 132, the organic sealing film 134, and the second inorganic sealing film 136, even if a crack occurs in the sealing unit 130, the crack may not be connected between the first inorganic sealing film 132 and the organic sealing film 134, or between the organic sealing film 134 and the second inorganic sealing film 136 through the multilayer structure. In this manner, the formation of a penetration path of external moisture or oxygen into a display unit may be prevented or minimized.

Figure 4:
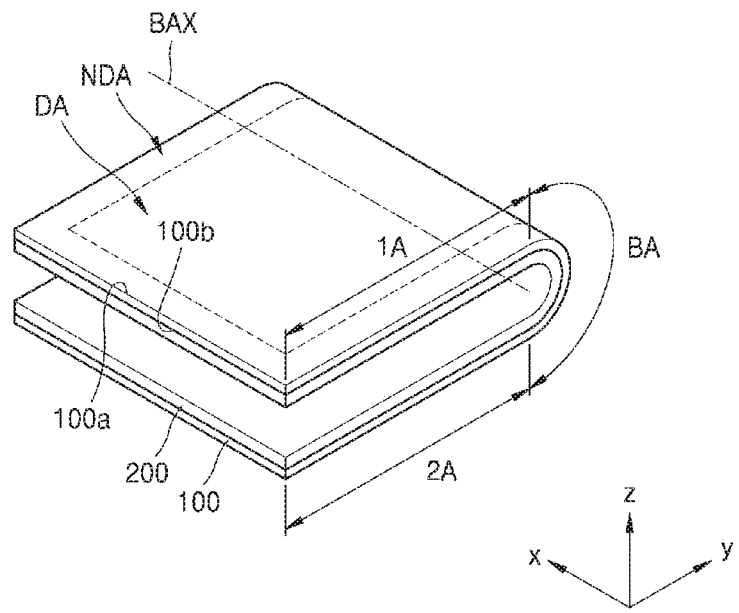
FIG. 4 is a perspective view of a display device according to an exemplary embodiment.
Figure 5:
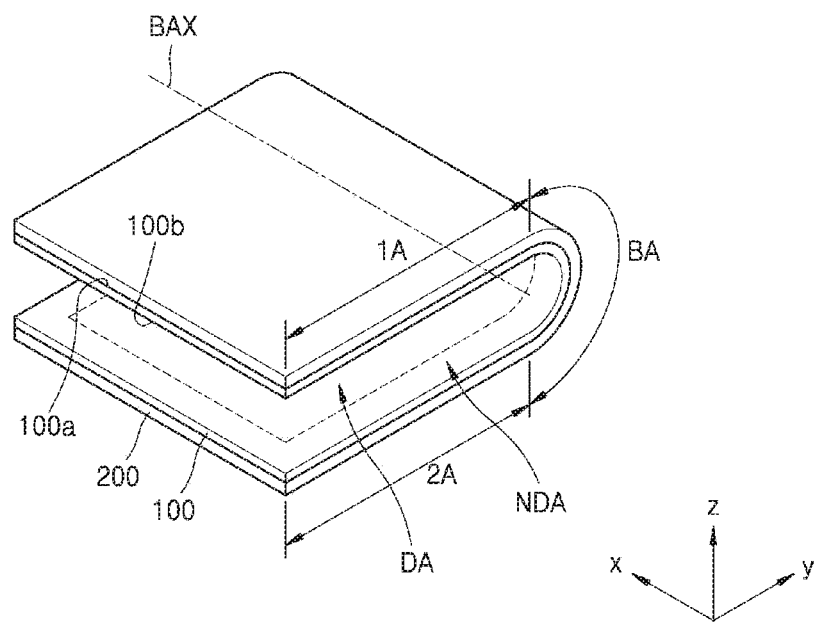
FIG. 5 is a perspective view of a display device according to an exemplary embodiment.

FIG. 4 is a perspective view of a display device according to an exemplary embodiment, and FIG. 5 is a perspective view of a display device according to an exemplary embodiment.

FIGS. 4 and 5 illustrate various exemplary embodiments of the display panel 100. The display panel 100 according to an exemplary embodiment may have flexibility, and can be bendable or foldable. All or a portion of the display panel 100 may be bent or folded at a predetermined angle, or a shape of the display panel 100 may be deformed according to a user's demand.

Referring to FIGS. 4 and 5, the display panel 100 of the display device according to the exemplary embodiment has a bending area BA extending in a first direction (+x direction). The bending area BA is located between a first area 1A and a second area 2A in a second direction (+y direction) intersecting the first direction. The flexible substrate 110 may be bent around a bending axis BAX extending in the first direction (+x direction).

In the exemplary embodiment of FIG. 4, a display area DA may be located on one surface 100a of the display panel 100. The display area DA may include an emission area for displaying an image to the outside, and a non-display area NDA may surround the display area DA. The lower protective film 200 may be arranged on the other surface 100b of the display panel 100. In the exemplary embodiment of FIG. 4, the display area DA of the display panel 100 may be bent or folded outward. Accordingly, the lower protective film 200 may be bent or folded to have a shape facing each other.

In the exemplary embodiment of FIG. 5, the display area DA may be located on the other surface 100b of the display panel 100. The lower protective film 200 may be arranged on the surface 100a of the display panel 100. In the exemplary embodiment, the display area DA of the display panel 100 may be bent or folded inward. Accordingly, the lower protective film 200 may be bent or folded outward.

In the display device in which the entire display panel 100 is bent or folded, the thicknesses of functional layers stacked on upper and lower portions of the display panel 100 is critical to secure the flexibility of the display device. Therefore, the display device according to the exemplary embodiment provides the lower protective film 200 formed integrally with the light-shielding layer 240 so as to have a thickness of about 1/10 of that of a conventional light-shielding film. Thus, a display device having the same light-shielding effect as before but having a drastically reduced thickness may be implemented.

Figure 6:
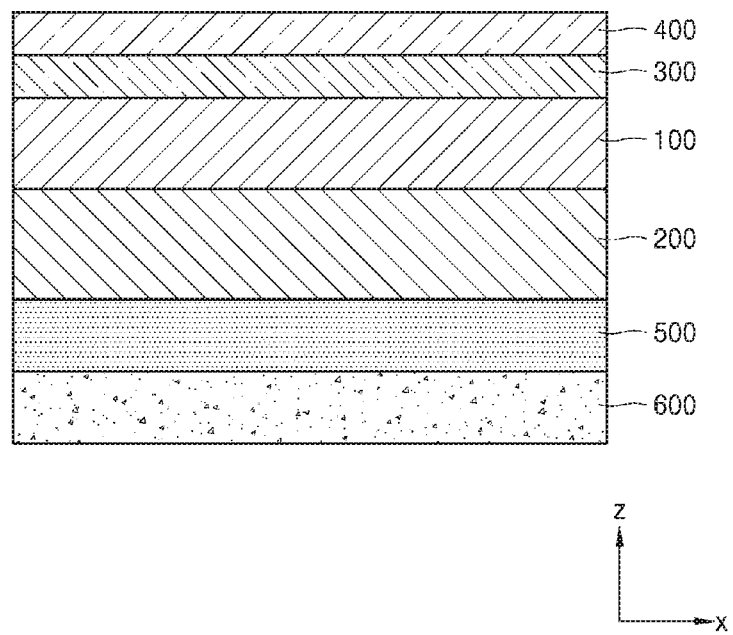
FIG. 6 is a cross-sectional view of a display device according to an exemplary embodiment.

FIG. 6 is a cross-sectional view of a display device according to an exemplary embodiment.

Referring to FIG. 6, the display device according to the exemplary embodiment may further include the display panel 100, the lower protective film 200 arranged on the surface 100a of the display panel 100, and a touch screen layer 300 arranged on the other surface 100b of the display panel 100, and a window layer 400. In the exemplary embodiment, the display panel 100 and the lower protective film 200 are the same as those in the above exemplary embodiments.

The touch screen layer 300 may be formed on a transparent substrate in the form of a separate panel and may be laminated with the display panel 100 or directly formed on the display panel 100 to be integrally formed. The window layer 400 may be arranged on the touch screen layer 300. In an alternative exemplary embodiment, a polarizing layer (not shown) may further be interposed between the window layer 400 and the display panel 100, and the window layer 400, the polarizing layer, and the display panel 100 may be attached to each other through the transparent adhesive layer 220 (not shown) such as an optically clear adhesive (OCA) interposed therebetween.

Meanwhile, a heat dissipation layer 500 and a shock absorbing layer 600 may be arranged on one side of the lower protective film 200. The heat dissipation layer 500 may dissipate heat generated from the display panel 100 to the outside and the shock absorbing layer 600 may prevent wirings or elements of the display panel 100 from being damaged by an external shock. In the exemplary embodiment, the shock absorbing layer 600, the heat dissipation layer 500, and the lower protective film 200 are stacked in the given order, but the order of arranging the heat dissipation layer 500 and the shock absorbing layer 600 may be changed.

Although only a display device has been described so far, the exemplary embodiments are not limited thereto. For example, a method of manufacturing such a display device is also within the scopes of the exemplary embodiments.

Figure 7:
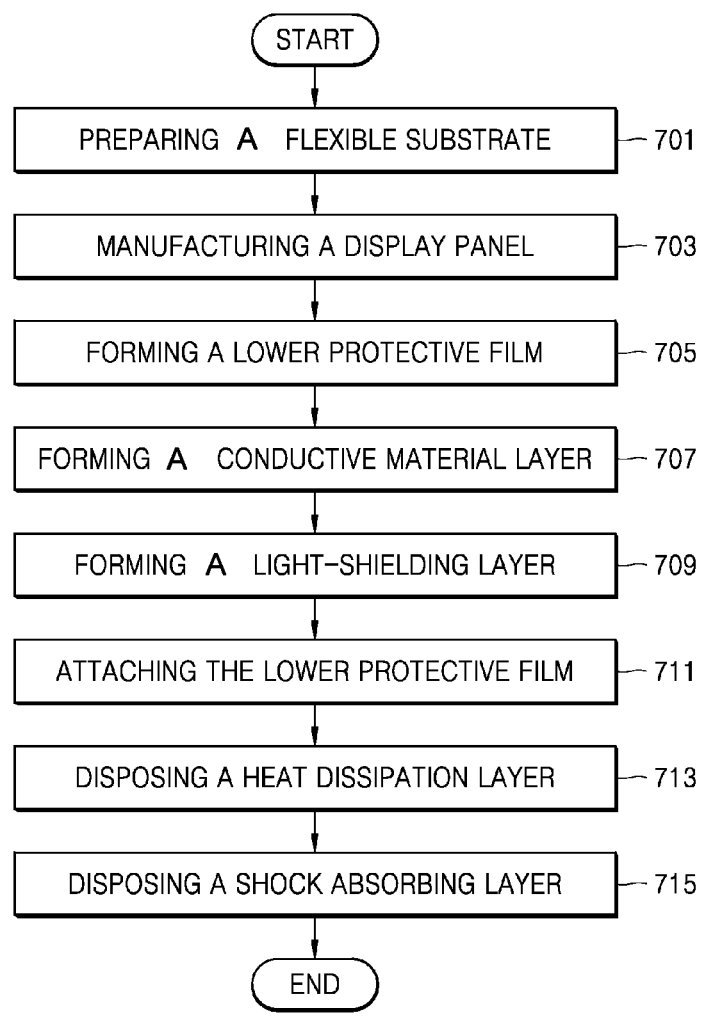
FIG. 7 is a flowchart illustrating a method of manufacturing a display device according to an exemplary embodiment.

FIG. 7 is a flowchart illustrating a method of manufacturing a display device as described in FIGS. 1-6.

Referring to FIG. 7, in order to manufacture the display device according to the exemplary embodiment, first, an operation of manufacturing the display panel 100 is performed. The operation of manufacturing the display panel 100 may include an operation 701 of preparing the flexible substrate 110 having the first surface 110a and the second surface 110b opposite the first surface 110a, and an operation 703 of forming the display unit 120 on the first surface 110a of the flexible substrate 110.

Thereafter, an operation 711 of attaching the lower protective film 200 under the display panel 100 may be performed after an operation of forming the lower protective film 200. The operation 705 of forming the lower protective film 200 may include an operation of forming the base film 210 and the adhesive layer 220 on the surface 210a of the base film 210, an operation 707 of forming the conductive material layer 230 on the other surface 210b of the base film 210, and an operation 709 of forming the light-shielding layer 240 on the conductive material layer 230.

Thereafter, an operation 713 of arranging a heat dissipation layer on a side of the light-shielding layer that is away from the display panel and an operation 715 of arranging a shock absorbing layer on a side of the heat dissipation layer that is away from the light-shielding layer may further be included.

According to exemplary embodiments as described above, a display device having an excellent light-shielding ratio and improved flexibility at the same time, and a method of manufacturing the same may be achieved. However, the scope of the exemplary embodiments are not limited to the effect.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
a flexible substrate comprising a first surface and a second surface opposite the first surface;
a display unit arranged on the first surface of the flexible substrate; and
a lower protective film arranged on the second surface and comprising a base film, an adhesive layer arranged on one side of the base film, a light-shielding layer arranged on an other side of the base film, and a conductive material layer interposed between the base film and the light-shielding layer.

2. The display device of claim 1, wherein
the conductive material layer comprises a first organic material and conductive particles dispersed in the first organic material.

3. The display device of claim 2, wherein
the light-shielding layer comprises a second organic material and light-shielding particles dispersed in the second organic material.

4. The display device of claim 3, wherein
the first organic material and the second organic material comprise an identical material.

5. The display device of claim 3, wherein
the light-shielding layer is disposed directly on the conductive material layer.

6. The display device of claim 5, wherein
the light-shielding layer is coated on the conductive material layer by using a thermal transfer method.

7. The display device of claim 1, wherein
the base film, the conductive material layer, and the light-shielding layer are sequentially stacked on the adhesive layer and are integrally formed, and the adhesive layer is in direct contact with the second surface of the flexible substrate.

8. The display device of claim 1, wherein
the light-shielding layer has a thickness of about 1 μm to about 3 μm.

9. The display device of claim 1, wherein
the base film comprises an organic material that is flexible.

10. The display device of claim 1, further comprising:
a heat dissipation layer disposed on a side of the light-shielding layer that is away from the display unit, and a shock absorbing layer interposed between the light-shielding layer and the heat dissipation layer.

11. A method of manufacturing a display device, the method comprising:
manufacturing a display panel by preparing a flexible substrate comprising a first surface and a second surface opposite the first surface, and forming a display unit on the first surface of the flexible substrate;
forming a lower protective film by forming a base film and an adhesive layer on one side of the base film, forming a conductive material layer on the other side of the base film, and forming a light-shielding layer on the conductive material layer; and
attaching the lower protective film on the second surface.

12. The method of claim 11, wherein
the conductive material layer comprises a first organic material and conductive particles dispersed in the first organic material.

13. The method of claim 12, wherein
the light-shielding layer comprises a second organic material and light-shielding particles dispersed in the second organic material.

14. The method of claim 13, wherein
the first organic material and the second organic material comprise an identical material.

15. The method of claim 13, wherein
the light-shielding layer is disposed directly on the conductive material layer.

16. The method of claim 15, wherein
the light-shielding layer is formed on the conductive material layer by using a thermal transfer method.

17. The method of claim 11, wherein
the base film, the adhesive layer, the conductive material layer, and the light-shielding layer of the lower protective film are integrally formed.

18. The method of claim 11, wherein
the light-shielding layer has a thickness of about 1 μm to about 3 μm.

19. The method of claim 11, wherein
the base film comprises an organic material that is flexible.

20. The method of claim 11, further comprising:
disposing a heat dissipation layer on a side of the light-shielding layer that is away from the display panel; and
disposing a shock absorbing layer on a side of the heat dissipation layer that is away from the light-shielding layer.

* * * * *